(12) United States Patent
Wieduwilt et al.

(10) Patent No.: US 12,419,044 B2
(45) Date of Patent: Sep. 16, 2025

(54) ANTIFUSE DEVICE HAVING INTERCONNECT JUMPER

(71) Applicant: Micron Technology, Inc., Boise, ID (US)

(72) Inventors: Christopher G. Wieduwilt, Boise, ID (US); James S. Rehmeyer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 465 days.

(21) Appl. No.: 17/968,707

(22) Filed: Oct. 18, 2022

(65) Prior Publication Data
US 2024/0128189 A1  Apr. 18, 2024

(51) Int. Cl.
*H10B 20/20* (2023.01)
*H01L 23/528* (2006.01)
*H10D 1/40* (2025.01)
*H01L 23/532* (2006.01)

(52) U.S. Cl.
CPC ........... *H10B 20/20* (2023.02); *H01L 23/528* (2013.01); *H10D 1/40* (2025.01); *H01L 23/53209* (2013.01); *H01L 23/53228* (2013.01); *H01L 23/53242* (2013.01); *H01L 23/53257* (2013.01)

(58) Field of Classification Search
CPC ....................................................... H10B 20/20
USPC ............................................................ 365/96
See application file for complete search history.

(56) References Cited

U.S. PATENT DOCUMENTS

| | | | | |
|---|---|---|---|---|
| 5,604,694 | A * | 2/1997 | Callahan | G11C 17/18 365/96 |
| 6,927,997 | B2 * | 8/2005 | Lee | G11C 17/16 365/96 |
| 7,772,591 | B1 * | 8/2010 | Shih | H10B 20/00 257/50 |
| 2007/0008800 | A1 * | 1/2007 | Jenne | G11C 17/165 365/225.7 |
| 2007/0076463 | A1 * | 4/2007 | Keshavarzi | G11C 29/027 365/96 |
| 2010/0182858 | A1 * | 7/2010 | Kaku | G11C 17/18 365/194 |
| 2017/0084620 | A1 * | 3/2017 | Wu | H10B 20/25 |

* cited by examiner

*Primary Examiner* — Muna A Techane
(74) *Attorney, Agent, or Firm* — Dorsey & Whitney LLP

(57) ABSTRACT

An antifuse device, including a gate having a gate dielectric layer; a first doping region connected to a first end of the gate; a second doping region connected to a second end of the gate, the second end being opposite to the first end of the gate; a channel that is disposed under the gate and that connects the first doping region and the second doping region; and an interconnection jumper that electrically connects the first doping region and the second doping region.

19 Claims, 8 Drawing Sheets

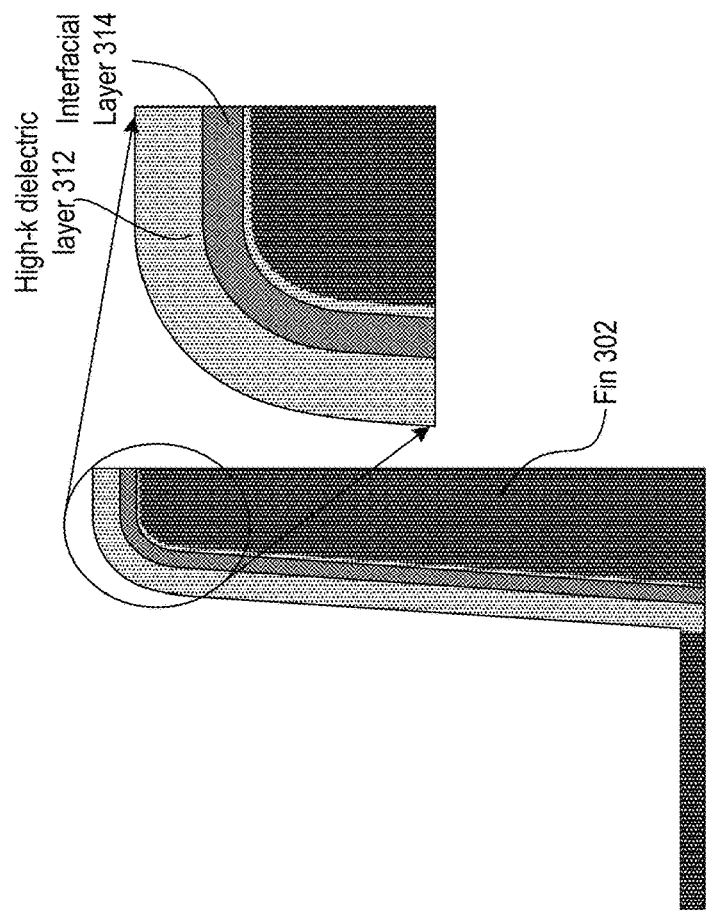
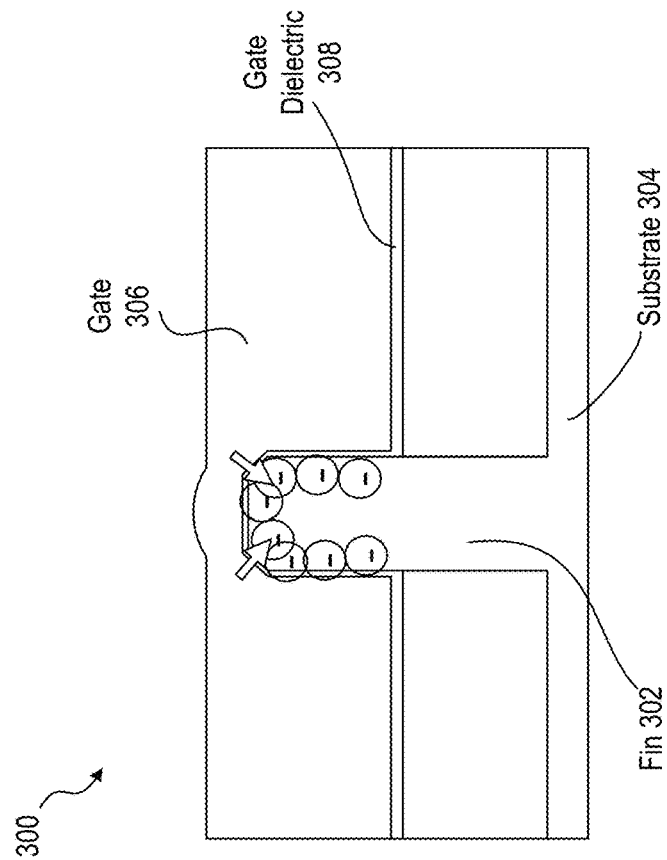
FIG. 3B
FIG. 3A

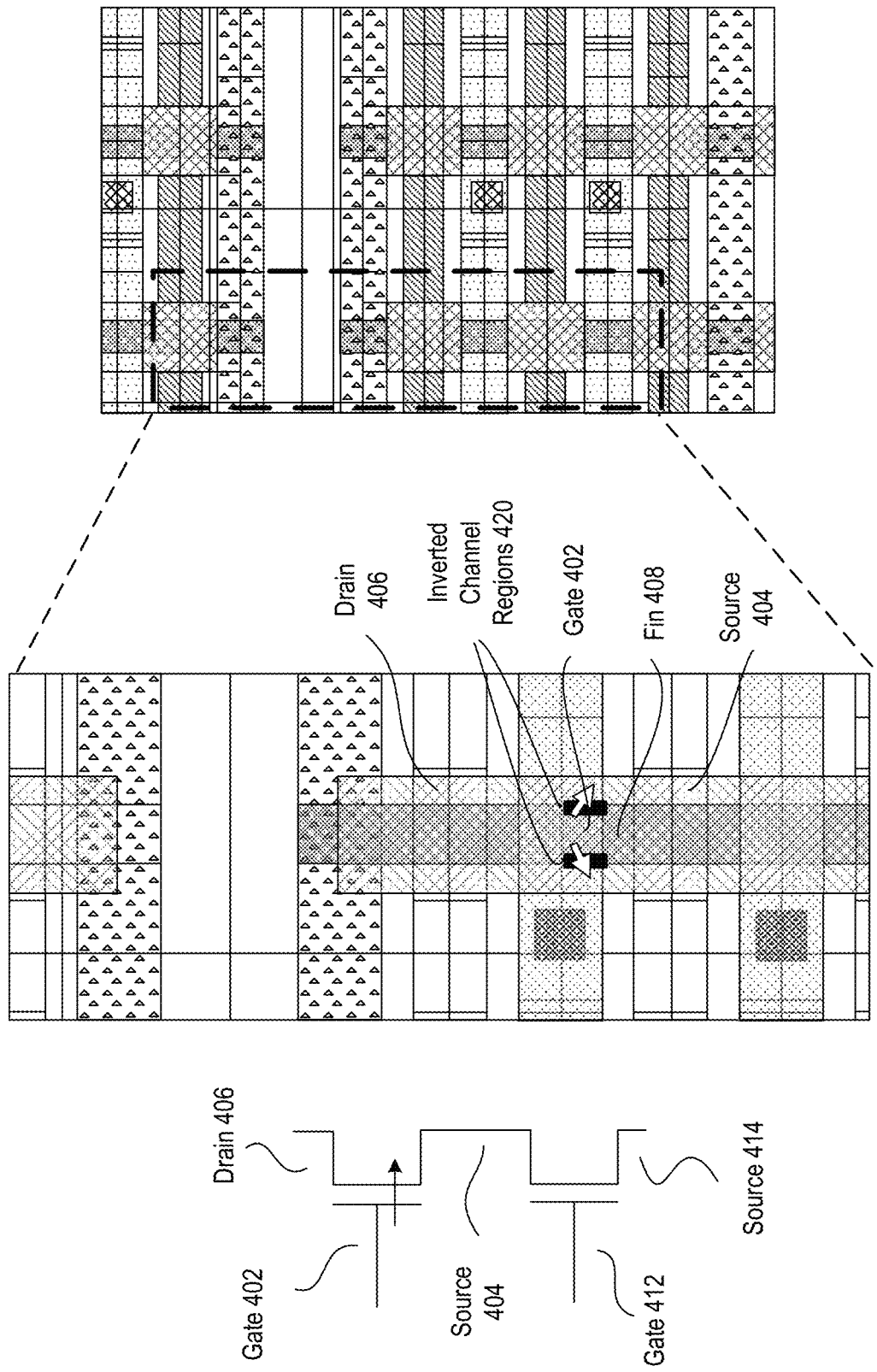

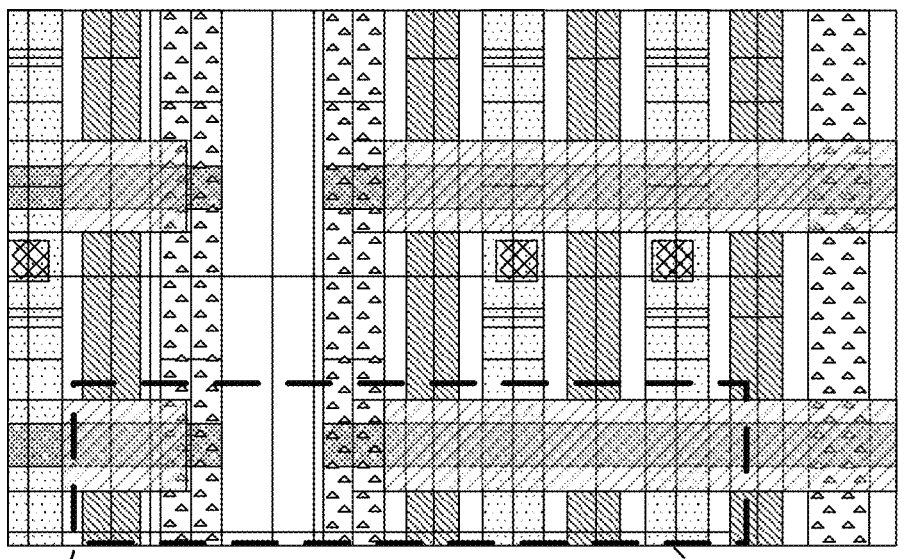
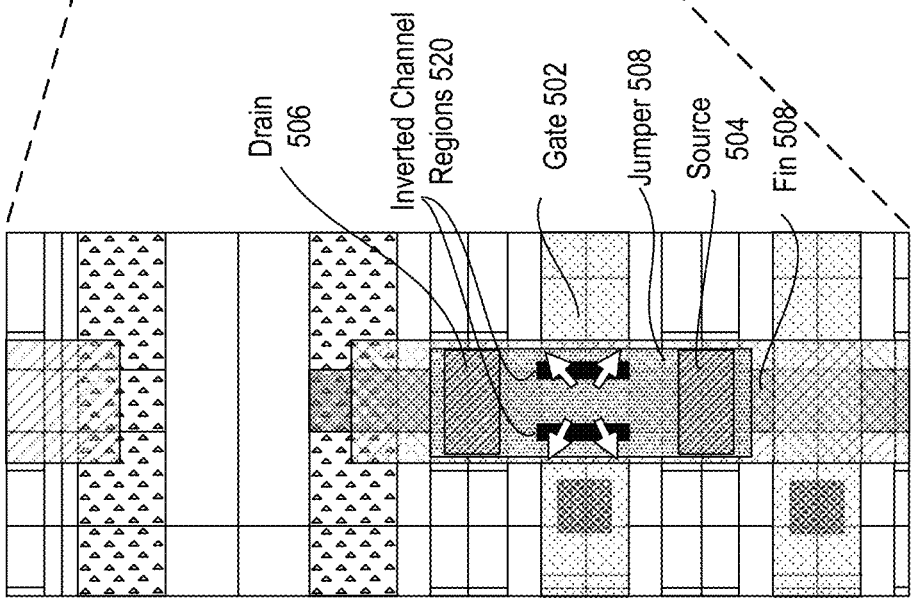
*FIG. 5B*
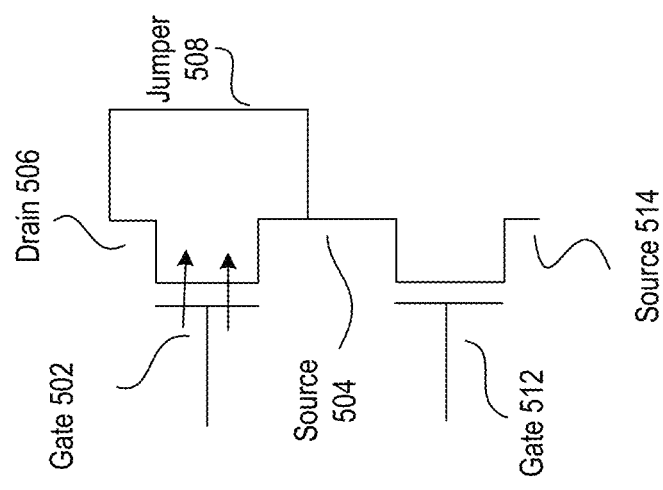
*FIG. 5A*

ANTIFUSE DEVICE HAVING INTERCONNECT JUMPER

TECHNICAL FIELD

The present disclosure generally relates to semiconductor devices, and more particularly relates to semiconductor antifuse device having interconnect jumper.

BACKGROUND

Microelectronic devices, such as memory devices, microprocessors, typically include electrical antifuse devices configured to program ingredients of the memory device or provide access to redundant circuitries. In general, antifuse device can be operated by dielectric layer breakdown upon applying an electric field across two electrodes located on opposite sides of the dielectric layer to induce a rupture, therefore causing reduction of the dielectric layer across the two electrodes. The antifuse device can be implemented using Metal-Oxide-Semiconductor Field Effect Transistor (MOSFET) process to achieve a short state through its gate dielectric layer. Moreover, conventional memory product includes planar MOSFET antifuse device that relies on a source side gate overhang. One of the challenges in implementing electrical antifuse device is a required high success rate of gate dielectric layer breakdown. In addition, with a trend of scaling the dimension of semiconductor memory devices, there is a need to further reduce the electrical antifuse device area.

BRIEF DESCRIPTION OF THE DRAWINGS

FIGS. 3A and 3B depict a FinFET device having a protruded fin with enhanced electric fields.

FIG. 4A depicts a circuit diagram of an antifuse device according to embodiments of the present technology.

FIG. 4B depicts a layout of an antifuse device according to embodiments of the present technology.

FIG. 5A depicts a circuit diagram of an antifuse device according to embodiments of the present technology.

FIG. 5B depicts a layout of an antifuse device according to embodiments of the present technology.

Figure 1:
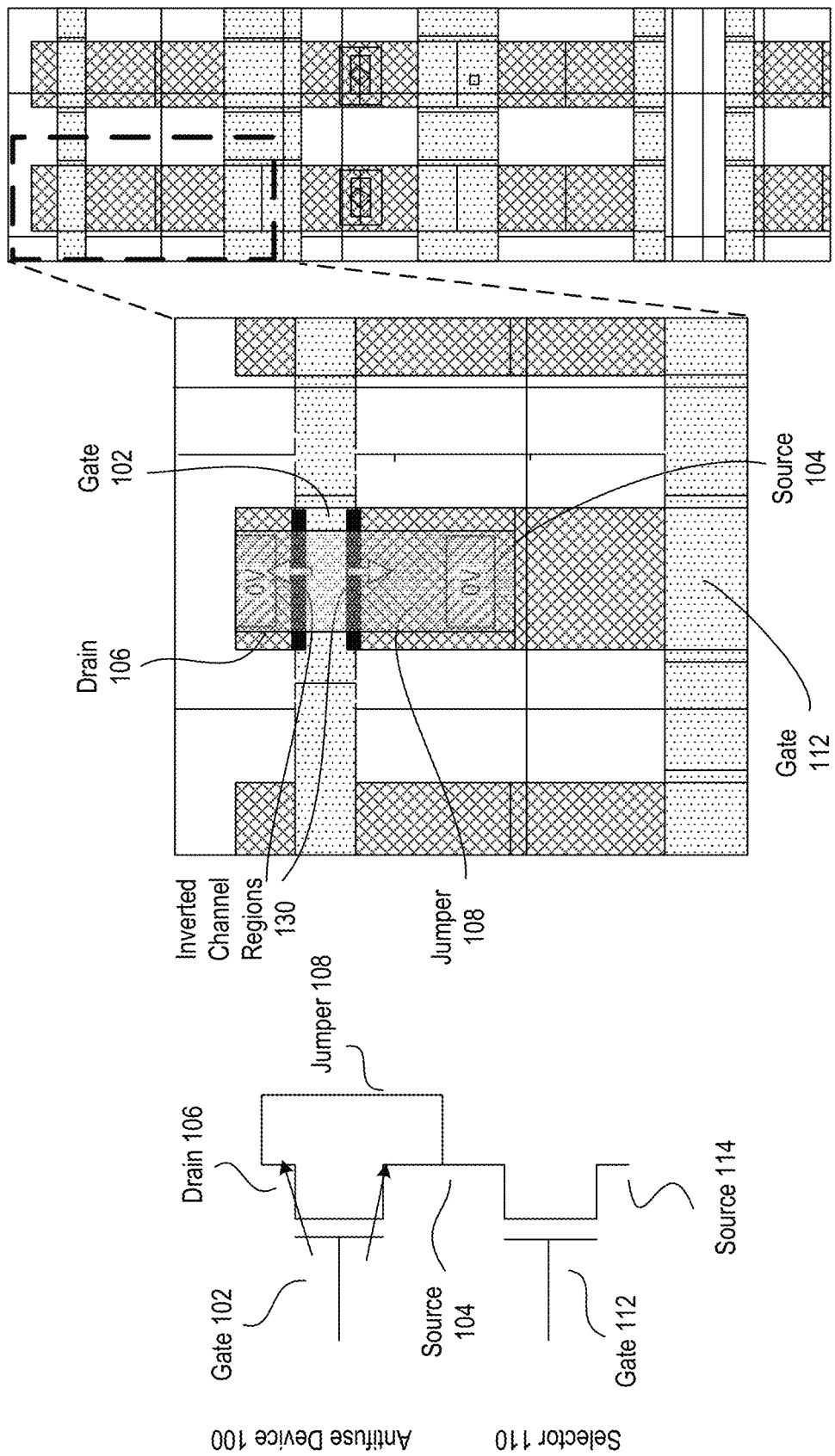
FIG. 1A depicts a circuit diagram of an antifuse device having interconnect jumper according to embodiments of the present technology.
FIG. 1B depicts a layout of an antifuse device having interconnect jumper according to embodiments of the present technology.

The drawings illustrate only example embodiments and are therefore not to be considered limiting in scope. The elements and features shown in the drawings are not necessarily to scale, emphasis instead being placed upon clearly illustrating the principles of the example embodiments. Additionally, certain dimensions or placements may be exaggerated to help visually convey such principles. In the drawings, the same reference numerals used in different embodiments designate like or corresponding, but not necessarily identical, elements.

DETAILED DESCRIPTION

Conventional MOSFET antifuse devices are not suitable to high density memory cell applications. They have limitations in redundancy and error correction due to variability of the fuse resistance and increase in fuse resistance along with a trend of device scaling. For example, the fuse resistance of the conventional MOSFET antifuse device increases when the gate width decreases with a given power supply applied thereon. Specifically, conventional planar MOSFET antifuse devices rely on only a source side gate overhang and gate dielectric breakdown therein to change the antifuse device from an open gate-source connection to a shorted gate-source connection.

To address these drawbacks and others, embodiments of the present technology provide antifuse devices using planar MOSFET or FinFET processes so as to achieve an improved fuse success rate and scalable antifuse device area. The antifuse devices can be implemented using the gate dielectric layer made of standard MOSFET process to exploit gate dielectric break down to short the antifuse device, and thereby does not need an additional mask step or process for the antifuse device implementation in memory products. Specifically, the antifuse devices utilize both a source node and a drain node of the MOSFET for the antifuse functions. Further, an interconnect jumper is implemented into the antifuse devices, electrically connecting the source node and the drain node of the antifuse devices. When programming, a voltage level of the drain node can be configured to be same to the source node, e.g., at 0V, through the interconnect jumper. By utilizing both of the source and drain nodes of the FET, the described antifuse devices can form primary breakdown regions at the source end as well as the node end of the channel, therefore creating two breakdown paths, i.e., a gate-source path and a gate-drain path. The enlarged primary breakdown regions enhance the chance of gate dielectric breakdown and improve the fuse success rate of the antifuse devices. Moreover, the width of the antifuse devices and an overall antifuse array area can be reduced without degrading the fuse success rate.

FIG. 1A shows an antifuse device 100 that is connected to a selector transistor 110. In this embodiment, the antifuse device 100 is implemented using planar MOSFET process to achieve a short state through its gate oxide layer. The antifuse device 100 can be constructed according on a structure of field effect transistor (FET). For example, the antifuse device 100 includes a gate 102, a source node 104, and a drain node 106. Specifically, the antifuse device 100 includes an interconnect jumper 108 that electrically connects the source node 104 and the drain node 106. In this example, the selector transistor 110 is connected to the antifuse device 100 by sharing a drain node of the selector transistor 119 with the source node 104 of the antifuse device 100. The selector transistor 110 can also be implemented by using planar MOSFET process and includes a gate 112 and a source node 114.

The gate 102 of the antifuse device 100 may be connected to a metal gate wordline (WL) of a memory device and the gate 112 of the selector transistor 110 may be connected to a select voltage which is configured to control/activate the antifuse device 100. When programming, the source node 114 of the selector transistor 120 may be connected to ground and the select voltage, e.g., 1V, may be applied on the gate 112. The selector transistor 110 is then turned on to ground the shared source node 104 of the antifuse device 100 to close to 0V. Here, the drain node 106 is also turned close to 0V because its voltage level is leveraged similarly to the source 104 through the electrical connection of the interconnect jumper 108. In addition, the memory WL may supply a high voltage, e.g., 5V, to the gate 102 of the antifuse device 100 in order to form a high $V_{gs}$ and $V_{gd}$ across the source node 104 and the drain nod 106, respectively.

In some embodiments, similar to conventional planar MOSFET device, the gate 102 of the antifuse device 100 includes a gate dielectric layer disposed on a channel that connects the source node 104 and the drain node 106. In particular, the gate 102 overhangs at least a portion of the source node 104 and a portion of the drain node 106. When programming the antifuse device 100 with a high gate voltage, the gate dielectric layer disposed close to the gate overhang regions may break down and lead to ohmic-like and symmetric post break down characteristics. The rupture of the gate dielectric layer form one or more conductive channels from the gate 102 to the source node 104 or the drain node 106, as arrows marked in FIG. 1A.

FIG. 1B shows a layout of the antifuse device 100 that includes the interconnect jumper 108 and that is connected with the selector transistor 110. This layout is presented in a plan view, including the gate 102, the source node 104, the drain node 106, and the interconnect jumper 108 of the antifuse device 100. The source node 104 and the drain node 106 are vertically aligned and a channel region is disposed therebetween. The gate 102 of the antifuse device 100 is aligned horizontally above the channel region. Further, the gate dielectric layer is disposed on a top surface of the channel region and below the metal gate. This layout also includes the selector transistor 110 that is connected to the antifuse device 100 through a shared source 104. Here, the selector 120 includes the gate 112 that is aligned in parallel to the gate 102 of the antifuse device 100.

In some embodiments and as shown in FIG. 1B, the gate 102 overhangs a portion of the source node 104 and a portion of the drain 106. When programming, the magnitude of local electrical field is enhanced in the gate overhang regions, causing inverted channel regions 130 that are align along the gate width direction. In this example, the antifuse device 100 includes two inverted channel regions 130 that are disposed close to the source node 104 and the drain node 106, respectively. These two inverted channel regions 130 may not be merged.

As shown in FIG. 1B, the interconnect jumper 108 can be disposed above the gate 102 of the antifuse device 100. It can be connected to the source node 104 and the drain node 106 though the source and drain contacts. The interconnect jumper 108 may have a length that similar or smaller than the length of the MOSFET implemented into the antifuse device 100. Further, the interconnect jumper 108 may have a width equal to or smaller than the gate width of the antifuse device 100. In addition, the interconnect jumper 108 may be made of at least one of copper, tungsten, molybdenum, nickel, titanium, tantalum, platinum, silver, gold, ruthenium, iridium, rhenium, rhodium, or alloys thereof.

Figure 2:
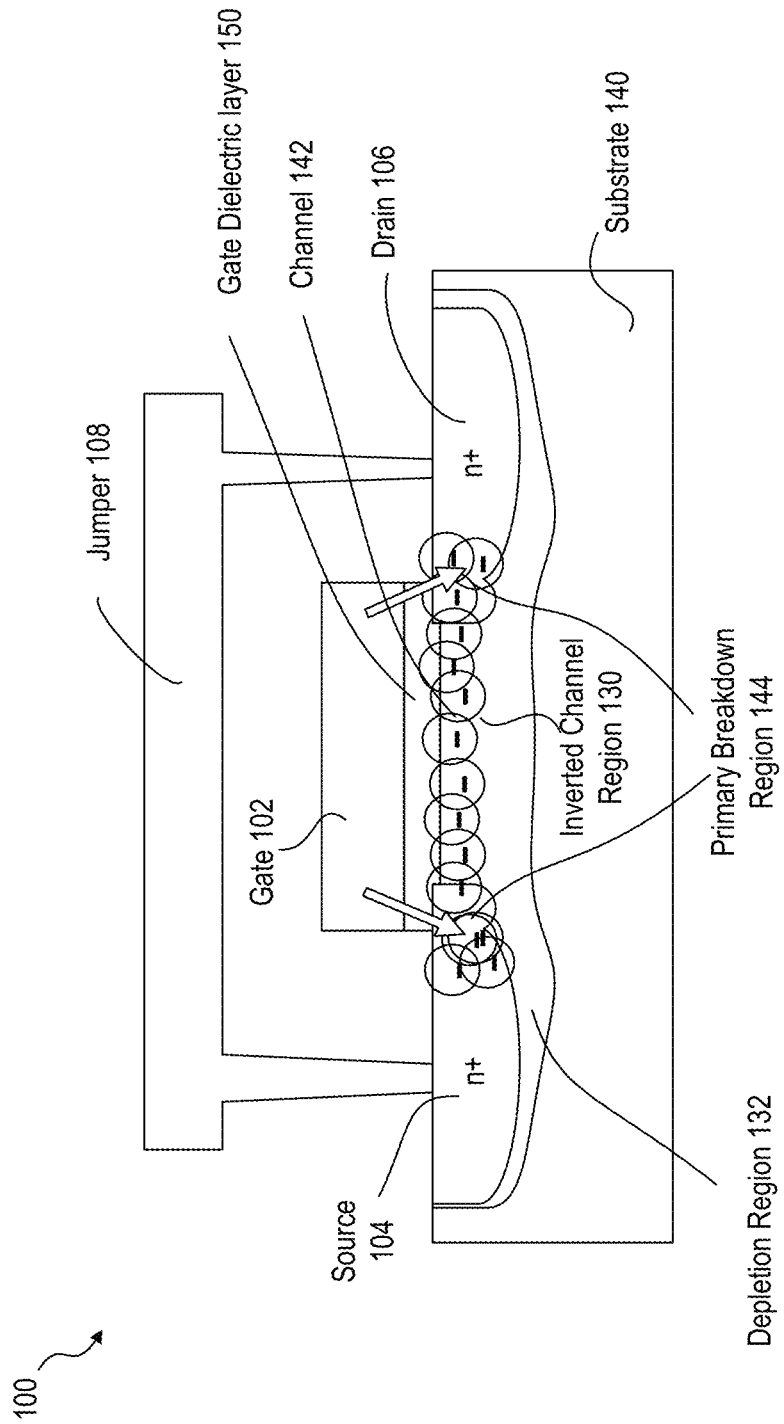
FIG. 2 depicts a cross-sectional schematic diagram of an antifuse device having interconnect jumper according to embodiments of the present technology.

FIG. 2 shows a cross-sectional schematic diagram of the antifuse device 100 implemented from a conventional MOSFET. The antifuse device 100 comprises the gate 102 disposed on a gate dielectric layer 150, the source 104, the drain 106, and the substrate 140. In some embodiments, the gate 102 may be formed of polysilicon or conductive metals. The gate dielectric layer 150 may be made of gate oxide, silicon dioxide, and/or silicon nitride. In some other embodiments, the gate dielectric layer 150 may comprise two gate dielectric portions, e.g., a thicker high-K dielectric layer and a thinner interfacial layer. The source and drain regions 104 and 106 are formed within the substrate 140 and may be heavily doped. In addition, the antifuse device 100 includes a depletion region 132. Generally, the source region 104 and the drain region 106 have higher concentration of dopants than the rest of the substrate 140. The source and drain regions 104 and 106 can be disposed within the depletion region 132. Further, the region in the substrate 140 is directly below the gate 102 and between the source region 104 and the drain region 106 is referred as a channel 142. In this example, the antifuse device 100 also includes the interconnect jumper 108 that is disposed above the gate 102 and electrically connects the source region 104 and the drain region 106. The interconnect jumper 108 may be isolated from other ingredients of the MOSFET by one or more dielectric materials.

In an exemplary embodiment, the antifuse device 100 may be fabricated based on NMOS transistor processes, and the source and drain regions 104 and 106 may contain a higher concentration of n-type dopants. Moreover, the depletion region 132 can be an insulating region within a conductive/doped semiconductor material, e.g., the substrate 140, where the mobile charge carriers have been diffused away or have been forced away by an electric field. In this example, the depletion region 132 may be formed due to the electron carriers being drawn to the inverted channel region 130. As shown in FIG. 2, the gate 102 as well as gate dielectric layer 150 overhang a portion of the source region 104 and a portion of the drain region 106. In other words, the source and drain regions 104 and 106 extend toward the channel and under the gate 102. The gate dielectric breakdown paths are illustrated in FIG. 2 in arrows. The breakdown of the gate dielectric layer 150 can be caused by applying a high voltage Vg at the gate 102 while the source and drain 104 and 106 are grounded.

The antifuse device 100 is normally in an open status until a programming voltage is applied on its gate 102. By applying the gate voltage, a resulting current will lead the antifuse device 100 to permanently break down or blow the gate dielectric layer 150 to rupture. Once the antifuse device 100 is break down, it acts as a closed short circuit. Generally, the gate dielectric layer 150 is ruptured at the gate overhang regions where the source and drain doping levels are high and a low resistance path can be formed between the gate to the source 104 or the drain 106. The carrier concentration in the channel is lower than the source 102 or the drain 104, therefore a fully converted region can be formed under the gate overhang regions where a higher electric field exists when the programming voltage is applied to the gate 102. In particular, the antifuse device 100 may include two primary breakdown regions 144 that are close to the gate overhang regions and that correspond to gate dielectric break down paths in the antifuse device 100.

As discussed, the antifuse device 100 includes the drain node 106, which has a voltage level similar to the source node 104. The leverage of source 104 and drain 106 voltages are achieved by the electrical interconnection through the interconnect jumper 108. Compare to traditional planar MOSFET implemented antifuse device which does not include an active drain, the antifuse device 100 utilizes both of the source 104 and the drain 106 for gate dielectric breakdown. The antifuse device 100 contains two inverted channel regions 130 for blowing the gate dielectric layer 150, doubling a total perimeter of the antifuse device 100 that is vulnerable to the gate dielectric breakdown. In some embodiments, a planar MOSFET with reduced gate width can be implemented in the present technology for the antifuse device scaling. As discussed, the antifuse device 100 includes doubled inverted channel regions 130 compared to traditional applications, therefore the implemented MOSFET with reduced gate width can achieve a similar or greater success rate on gate dielectric breakdown. The width reduced MOSFET can be introduced to the present technology to reduce the antifuse device width and improve overall fuse array area density in the memory device.

FIGS. 3A and 3B illustrate a FinFET device 300 having enhanced electric fields at the fin top corners. For example, FIG. 3A shows a cross sectional view of the FinFET device 300 which includes a fin 302 protruding from a substrate 304. The fin 302 can be patterned from an epitaxial layer deposited on the substrate 304 or etched out of the substrate 304. The fin 302 can be made of materials including silicon and silicon germanium. A bottom portion of the fin 320 is surrounded by a shallow trench isolation (STI) for electrical isolation from the FinFET device 300 to the substrate or adjacent devices disposed on the substrate 304. In addition, an exposed portion of the fin 302 is encapsulated through the gate 306 through a gate dielectric layer 306. The gate 306 may be made of metal gate materials including titanium nitride, tungsten nitride, tantalum nitride, and/or molybdenum nitride. The gate dielectric 308, as shown in FIG. 3B, may include a high-K dielectric layer 312 and an interfacial layer 314. The high-k dielectric layer can be made of $HfO_2$ and the interfacial layer can be $SiO_2$. Generally, the interfacial layer 314 and the high-k dielectric layer 314 are sequentially formed on the exposed fin 302. The FinFET device 300 also includes a source region and a drain region (not shown) that are disposed at both ends of the fin 302.

As shown, the FinFET device 300 may be a n-channel FET in which a positive gate to source voltage is needed to create a conductive channel between the source and drain. The positive gate voltage attracts free floating electrons within the fin body towards the top surface and sidewalls of the fin 302, forming the n type channel. In some other examples, the FinFET device 300 may be a p-channel FET in which a negative gate to source voltage is needed to create a conductive channel between the source and drain. The negative gate voltage attracts free floating holes within the fin body towards the top surface and sidewalls of the fin, forming the p type channel.

Because of the fin geometrical shape, there is a charge injection at fin corners which is in proportional to the curvature radius at fin corners. For FinFET device 300, the electric field at its fin top corners is always amplified compared to the electric field at its sidewall. For example, the electric field at fin top corners can be as high as $2e^{+7}$ V/cm and the electric field at fin sidewall can be reduced to around $1e^{+7}$ V/cm when a same gate voltage is applied. As a result, the fin corner effect improves the performance of the FinFET device 300 through enhancing its on-current at the fin corners. Meanwhile, the enhanced electrical field may cause an easier gate dielectric breakdown at the fin top corners compare to that on the fin top surface and fin sidewalls. In addition, the interfacial layer 314 disposed at fin bottom edge usually has a relatively poor film quality compared to the interfacial layer 314 dispose on fin sidewall and top surface, due to process limitations related to the geometry restraints thereon. Therefore, the fin bottom edge region may be a secondary gate dielectric beak down region in which the interfacial layer 314 ruptures.

FIG. 4A shows an antifuse device 400 connected with a selector transistor 410. Both of the antifuse device 400 and the selector transistor 410 can be implemented using FinFET processes. Specifically, the antifuse device 400 can be fabricated based on FinFET device structure. In some embodiments, the antifuse device 400 includes a gate 402, a source node 404, and a drain node 406. The selector transistor 410 can also be fabricated based on the FinFET device structure and includes a gate 412, a source 414, and a drain that is shared with the source 404 of the antifuse device 400. The selector transistor 410 is connected to the antifuse device 400 at the source 404.

In some embodiments, the gate 402 of the antifuse device 400 may be connected to a metal gate WL of a memory device and the gate 412 of the selector transistor 410 may be connected to a select voltage configured to control/select the antifuse device 400. When programming, the source node 414 of the selector transistor 410 is grounded and a select voltage, e.g., 1V, can be applied to the gate 412. The selector transistor 410 is then turned on to ground the shared source node 404 of the antifuse device 400 to close to 0V. In this example, the drain node 406 of the antifuse device 400 may be floating and present a high impedance. The drain node 406 is included here in the antifuse device 400 in order to comply with the FinFET device design rule, e.g., a constant contacted poly pitch (CPP) throughout a die. Once the source node 404 of the antifuse device 400 is configured to be close to ground, the memory WL may supply a high voltage, e.g., 5V, to the gate 402 to form a high $V_{gs}$ across the gate 402 and the source 404.

As discussed in FIG. 3, FinFET device includes a gate dielectric layer wrapping up the exposed fin. In this example, the antifuse device 400 includes a gate dielectric layer encapsulating a top surface and sidewalls of the fin which connects the source node 404 and the drain node 406. When programming the antifuse device 400 with a high gate voltage, the gate dielectric layer may break down along a path from the gate 402 to the source 404, indicating by the arrow. The blowing of the gate dielectric may happen at the fin top corners, where the electric field is amplified due to the fin corner geometry. In addition, the gate dielectric layer of the antifuse device 400 may rupture at the fin bottom edge, where an interfacial layer of the gate dielectric layer has a relatively poor quality due to its process limitations related to the geometry restraints at fin bottom.

Turning to FIG. 4B, which shows a layout of the antifuse device 400 and the selector transistor 410. This layout is presented in a plan view, including the gate 402, the source node 404, and the drain node 406 of the antifuse device 400. The source node 404 and the drain node 406 are vertically aligned and each connects to one end of the fin 408. The gate 402 of the antifuse device 400 is aligned perpendicular to the fin 408 length direction. In addition, the gate 402 includes a gate dielectric layer that is disposed on a top surface and two sidewalls of the fin 408. This layout also shows the selector transistor 410 connected to the antifuse device 400 through the shared source 404. Specifically, the selector transistor 410 includes the gate 412 that is aligned in parallel to the gate 402 of the antifuse device 400.

In some embodiments, the antifuse device 400 may include two inverted channel regions 420 as marked in FIG. 4B. The inverted channel regions 420 may be disposed at the top corners of the fin 408 and extend from the source side edge of the fin toward the drain node 406. The length and width of each of the inverted channel region 420 may be in proportional to the programming voltage applied on the gate 402. When programming, the antifuse device 400 may form enhanced electrical fields and the inverted channel regions 420 at the fin top corners, causing the gate dielectric to permanently rupture therethrough. One or more electrically short paths may be formed from the gate 402 to the source 404 of the antifuse device 400, as shown by the arrows.

In some other embodiments, the antifuse device 400 may form one or more electrical short paths through the fin 408 bottom edges, where the interfacial layer of the gate dielectric has a relatively poor quality. When programming, the interfacial layer at the fin 408 bottom edge may permanently rupture and form electrical short paths therethrough.

FIGS. 5A and 5B show another antifuse device 500 that is connected to a selector 510. Similar to the antifuse device 400 and the selector 410, and as shown in FIG. 5A, the antifuse device 500 and the selector 510 can be implemented using FinFET processes. For example, the antifuse device 500 may include a gate 502, a source node 504, and a drain node 506. The selector transistor 510 may include a gate 512, a source 514, and a drain that is shared with the source 504 of the antifuse device 500. The selector transistor 510 is connected to the antifuse device 500 at the source 504. In this example, the antifuse device 500 also includes an interconnect jumper 508 that electrically connects the source node 504 and the drain node 506.

In some embodiments, the gate 502 of the antifuse device 500 may be connected to a metal gate WL of a memory device and the gate 512 of the selector transistor 510 may be connected to a select voltage configured to control/select the antifuse device 500. When programming, the source node 514 of the selector transistor 510 is grounded and a select voltage, e.g., 1V, can be applied to the gate 512. The selector transistor 510 is then turned on to ground the shared source node 504 of the antifuse device 500 close to 0V. The drain node 506 of the antifuse device 500 will also have a voltage level close to 0V as it is electrically connected to the source node 504 through the interconnect jumper 508. In this example, the memory WL may apply a high voltage, e.g., 5V, on the gate 502 to program the antifuse device 500 by forming a high Vgs and Vgd across the source node 504 and the drain node 506, respectively. A gate dielectric layer of the antifuse device 500 may break down and lead to one or more short paths from the gate 502 to the source node 504 or the drain node 506, permanently converting the antifuse device 502 to a short state.

Turning now to FIG. 5B, which shows a layout of the antifuse device 500 and the selector transistor 510. The plan view layout shows that the antifuse device 500 includes the gate 402, the source node 404, the drain node 406, and the interconnect jumper 508. In some embodiments, the interconnect jumper 508 can be disposed above the fin 508 and the gate 502. In addition, the interconnect jumper 508 is connected with the source node 504 and the drain node 506 to equate the voltage levels therebetween. In this example, the interconnect jumper 508 is wider than the fin 508 along the horizontal direction. In some other embodiments, the interconnect jumper 508 may have a width equal to or less than that of the fin 508.

In some embodiments and when programming, the antifuse device 500 may include inverted channel regions 520 that are disposed on fin top corners and along the gate length. Specifically, the inverted channel regions 520 may extend across the whole gate length. As shown in FIG. 5A, the antifuse device may have two short paths from the gate 502 to the source node 504 or the drain node 506, respectively. When applying a programming voltage to the gate 502, inverted channel regions 520 within the fin 508 may be formed at source side fin edge corners and the drain side fin edge corners, extending to the drain side and the source side respectively along the fin top corners. Under certain high gate voltage, e.g., 5V, the inverted channel regions 520 originated from both ends of fin top corners may merge at a middle region of the fin 508, showing continuous fully inverted regions as shown in FIG. 5B.

Compared to the inverted channel regions 420 of the antifuse device 400, the inverted channel regions 520 of the antifuse device 500 may substantially increase the length of the inverted channel regions when programming. Since the FinFET based antifuse device gate dielectric breakdown is correlated to the area of fully inverted region, therefore the elongated inverted channel regions 520 enhance the fuse success rate when operating the antifuse device 500.

Figures 6A, 6B:
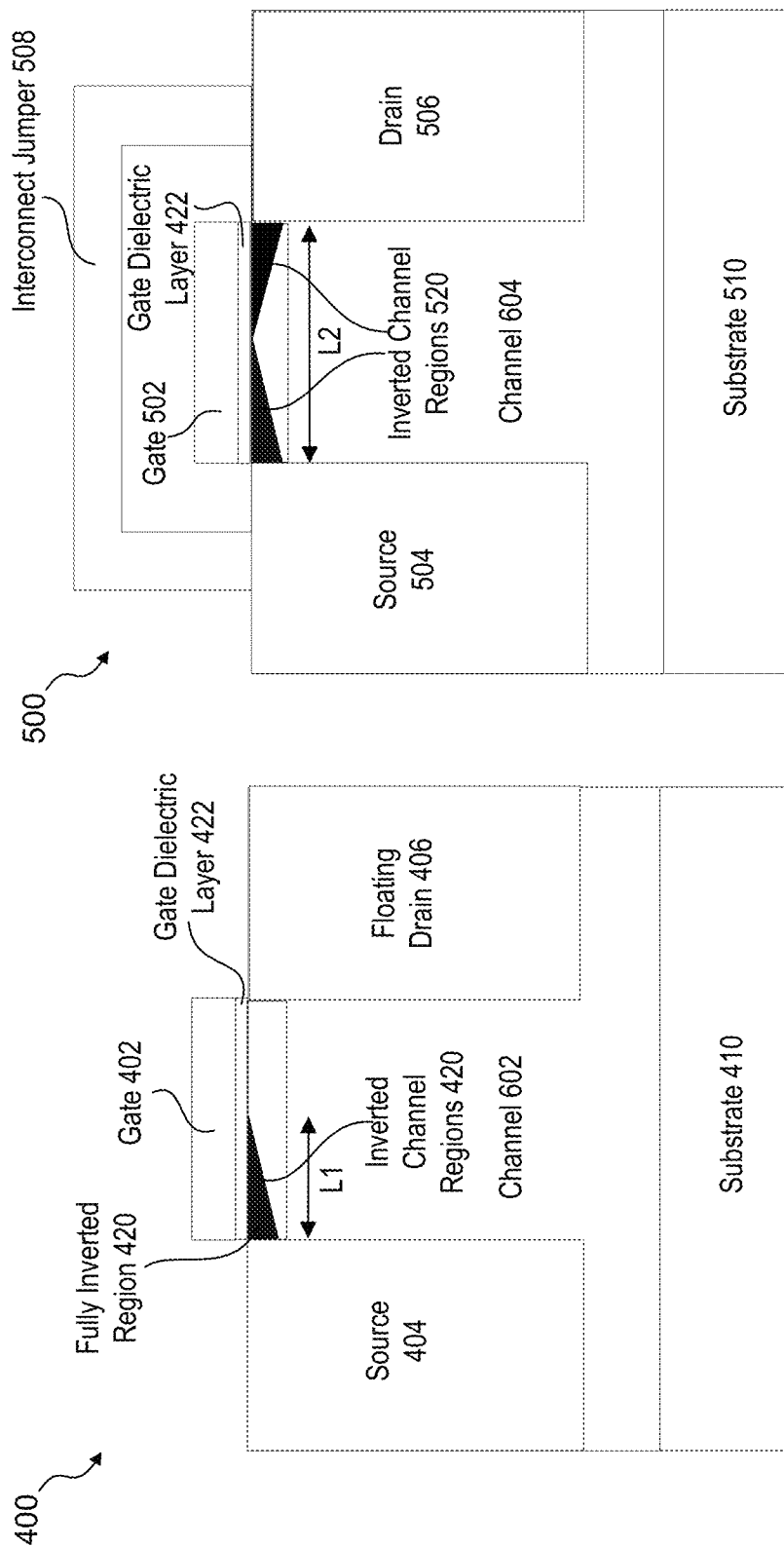
FIGS. 6A and 6B depict cross-sectional schematic diagrams of antifuse devices with and without interconnect jumper respectively, according to embodiments of the present technology.

FIGS. 6A and 6B show cross sectional views of schematic diagrams of antifuse device 400 and 500, respectively. Both diagrams are taken across a plane of the fin sidewall. As discussed, the antifuse devices 400 and 500 are implemented using FinFET processes. For example, the antifuse device 400 includes a channel 602 of part of the fin 408 disposed on substrate 410, the source 404 and the floating drain 406 being connected to both ends of the channel 602. The gate 402 has an orientation at right angles to the fin 408 and surrounds the top surface and sidewalls of the fin 408. In particular, the gate 402 includes a gate dielectric layer 422 directly disposed on the top surface and sidewalls of the fin 408.

In this example, the fin 408 provides the channel 602 between the source 404 and the drain 406. The gate 402 is configured to surround the channel from three sides of the fin 408 in order to provide electrostatic control of the channel with fully depleted region of carriers. When programming, the source node 404 is grounded and the drain node 406 keep floating. Upon application of electric field across the gate dielectric layer 422, the magnitude of the electrical field can be locally enhanced at the boundary between a high-K dielectric portion and an interfacial dielectric portion of the gate dielectric layer 422, due to the Fin 408 geometry. The voltage applied on gate 402 may form the inverted channel regions 420 in the channel at each of the fin 408 top corners, where enhanced electric fields exist. Specifically, the inverted channel regions 420 extend toward the floating drain node 406, each having a width W1 and a length L1, proportional to the applied gate voltage. As shown in FIG. 6A, applying gate voltage and tying the source node 404 to ground can not create a fully inverted channel between the source and drain, because the drain node 406 is floating and no depletion region exists therein. In this example, programming the antifuse device 400 may cause the gate dielectric breakdown at the top corners of the fin 408, where the inverted channel regions 420 are formed.

The antifuse device 500 is implemented by FinFET process similar to that of the antifuse device. For example, it includes the channel 604 disposed on substrate 510, the source 504 and the drain 506 being connected to both ends of the channel 604. The gate 502 has an orientation at right angles to the fin 508 and surrounds the top surface and sidewalls of the fin 508. The gate 502 includes gate dielectric layer 522 directly disposed on the top surface and sidewalls of the fin 508. The antifuse device 500 also includes the interconnect jumper 508 that electrically connects the source 504 and the drain 506. As shown in FIG. 6B, a horizontal portion of the interconnect jumper 508 may be disposed above the FinFET structure implemented. Electrical contacts may be formed between the interconnect jumper 508 to the source 504 and the drain 506. In addition, the interconnect jumper 508 may be made of at least one of copper, tungsten, molybdenum, nickel, titanium, tantalum, platinum, silver, gold, ruthenium, iridium, rhenium, rhodium, or alloys thereof.

In this example, the source node 504 and the drain node 506 have a same voltage level, leveraged by the interconnect jumper 508. When programming, the source node 504 is grounded through the activation of the selector transistor 510. As a result, the drain node 506 is also grounded through the electrical interconnection by the jumper 508. Here, depletion regions are formed in the source node region 504 as well as the drain node region 506. As shown in FIG. 6B, applying a gate voltage on the gate 502 may form two inverted channel regions 520 in the channel direction at each of the fin 508 top corners, where enhanced electric fields exist. The inverted channel regions 520 may locate at both ends of the channel and each extends toward the opposite fin end along the fin 508 top corners. The inverted channel regions 520 may be merged and have a length L2. In this example, programming the antifuse device 500 may cause the gate dielectric breakdown at the top corners of the fin 508, where two corresponding breakdown paths can be formed.

As shown in FIGS. 6A and 6B, the antifuse device 500 may include inverted channel regions 520 having a doubled length to that of the antifuse device 400. A fuse success rate of the antifuse device 500 may be also higher than that of the antifuse device 400, because the fuse success rate is determined by the chance of gate dielectric break down which is further proportional to the area of fully inverted channel regions. Here, utilizing the existing drain node 506 of the FinFET structure, the antifuse device 500 leverages the voltage levels of the source node 504 and drain node 506 through the interconnect jumper 508. This design also provides two potential breakdown paths, i.e., gate-source and gate-drain, and additional primary breakdown regions when programming the antifuse device 500, therefore enhancing its fuse success rate.

In this example, the source regions and drain regions can be formed through ion implantation in corresponding regions of the fin, doping various types of semiconductor materials to the source regions and drain regions, respectively. In some other examples, the source regions and drain regions of the FinFET antifuse device can be formed through etching of the fin to form trenches and then regrowing semiconductor materials such as SiGe therein.

Figure 7:
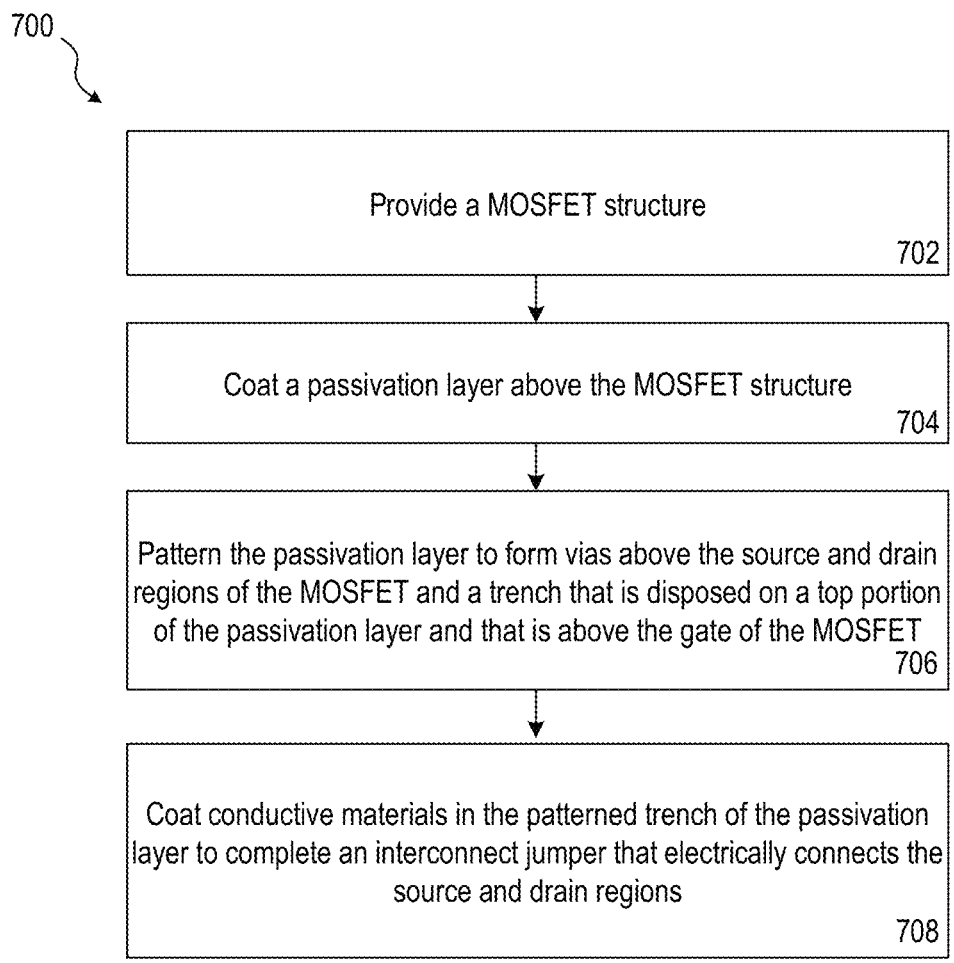
FIG. 7 is a flow chart illustrating a method of fabricating an antifuse device with an interconnect jumper according to embodiments of the present technology.

Turning now to FIG. 7, a flow chart illustrating a method 700 of forming an antifuse device by implementing MOSFET processes. The method 700 includes providing a MOSFET structure, at 702. For example, fabricating the antifuse device 100 by impending planar MOSFET processes to form the transistor device structure shown in FIGS. 1A, 1B, and 2. In this example, the planar MOSFET device may include the source node 104, the drain node 106 and a channel 142 disposed there between. The planar MOSFET device may also include a gate including gate dielectric layer 150 disposed above the channel 142 and overhangs a portion of each of the source node 104 and the drain node 106. In another example, the antifuse device 500 can be fabricated by implementing FinFET processes. For example, the antifuse device 500 may include the source node 504, the drain node 506, and the fin 508, wherein the source and drain nodes 504 and 506 are connected by the fin 508. The antifuse device 500 also includes the gate including the gate dielectric layer 522 disposed on the top surface and sidewalls of the fin 508.

The method 700 also includes coating a passivation layer above the MOSFET structure, at 704. For example, a dielectric layer may be coated on the MOSFET device. Specifically, the dielectric layer may cover a gate region, a source region, and a drain region of the MOSFET structure. In one example, the passivation layer may be coated above the source region 104, the drain region 106, and the gate 102 of the antifuse device 100. In another example, the passivation layer may be coated above the source region 504, the drain region 506, and the gate 502 of the antifuse device 500. The dielectric layer may be made of tetraethyl orthosilicate (TEOS), silicon oxide (SiO), silicon nitride (SiN), silicon borocarbonitride (SiBCN), silicon oxycarbonitride (SiOCN), silicon oxycarbide (SiOC), silicon carbonitride (SiCN), silicon boronitride (SiBN), a low-k dielectric material, or a combination thereof.

Further, the method 700 includes patterning the passivation layer to form vias above the source and drain regions of the MOSFET and a trench that is disposed on a top portion of the passivation layer and that is above the gate of the MOSFET, at 706. For example, the dielectric layer may be patterned above the source and drain regions 104 and 106, and fill with conductive materials therein to form via contacts. In addition, a top portion of the dielectric layer disposed above the gate 102 of the antifuse device 100 may be patterned to form a trench connected to the vias. In another example, the dielectric layer may be patterned above the source and drain regions 504 and 506, and fill with conductive materials therein to form via contacts. In addition, a top portion of the dielectric layer disposed above the gate 502 of the antifuse device 500 may be patterned to form a trench connected to the vias.

Lastly, the method 700 includes coating conductive materials in the patterned trench of the passivation layer to complete an interconnect jump that electrically connects the source and drain regions, at 708. For example, conductive materials can be coated above the gate 102 of the antifuse device 100 and connected with the vias to electrically connects the source and drain 104 and 106. In another example, conductive material can be coated above the gate 502 of the antifuse device 500 and connected with the vias to electrically connects the source and drain 504 and 506. The conductive materials can be made of at least one of copper, tungsten, molybdenum, nickel, titanium, tantalum, platinum, silver, gold, ruthenium, iridium, rhenium, rhodium, or alloys thereof. Moreover, the conductive materials can be deposited into the patterned top portion of the gate by using chemical vapor deposition, physical vapor deposition, atomic layer deposition, plating, electroless plating, spin coating, and/or other suitable techniques.

Figure 8:
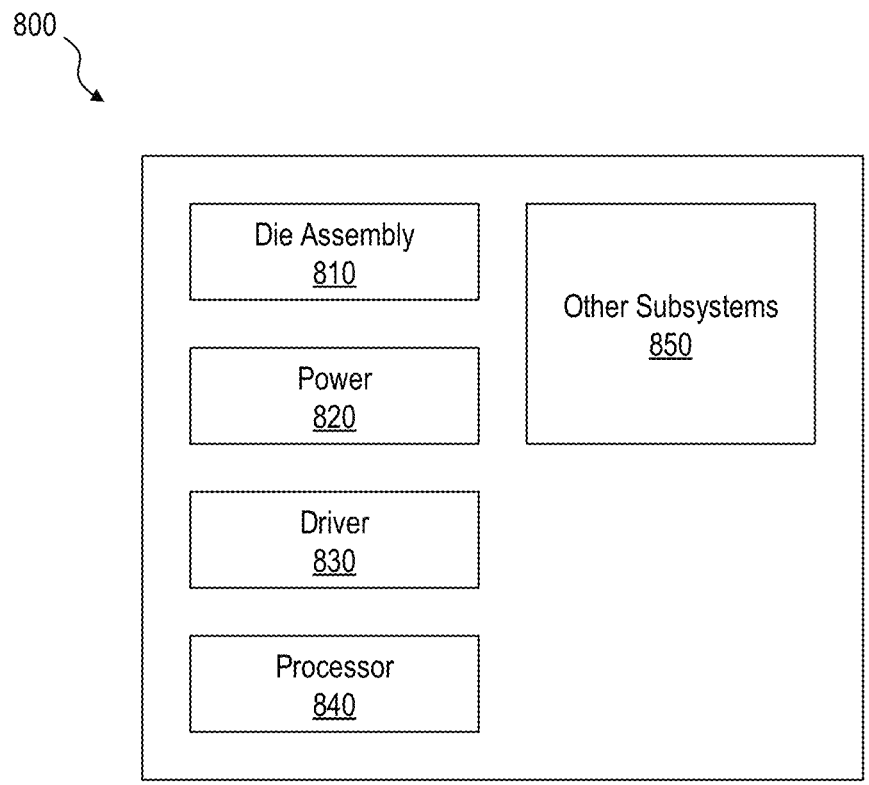
FIG. 8 is a schematic view of a system that includes a semiconductor device configured according to embodiments of the presented technology.

Any one of the semiconductor structures described above with reference to FIGS. 1-6 can be incorporated into any of a myriad of larger and/or more complex systems, a representative example of which is system 800 shown schematically in FIG. 8. The system 800 can include a semiconductor device 810, a power source 820, a driver 830, a processor 840, and/or other subsystems or components 850. The semiconductor device 810 can include features generally similar to those of the semiconductor devices described above, and can therefore include MOSFET structures for antifuse functions. The resulting system 800 can perform any of a wide variety of functions, such as memory storage, data processing, and/or other suitable functions. Accordingly, representative systems 800 can include, without limitation, hand-held devices (e.g., mobile phones, tablets, digital readers, and digital audio players), computers, and appliances. Components of the system 600 may be housed in a single unit or distributed over multiple, interconnected units (e.g., through a communications network). The components of the system 800 can also include remote devices and any of a wide variety of computer-readable media.

Specific details of several embodiments of semiconductor devices, and associated systems and methods, are described below. A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, plating, electroless plating, spin coating, and/or other suitable techniques. Similarly, materials can be removed, for example, using plasma etching, wet etching, chemical-mechanical planarization, or other suitable techniques.

In accordance with one aspect of the present disclosure, the semiconductor devices illustrated above could be memory dice, such as dynamic random access memory (DRAM) dice, NOT-AND (NAND) memory dice, NOT-OR (NOR) memory dice, magnetic random access memory (MRAM) dice, phase change memory (PCM) dice, ferroelectric random access memory (FeRAM) dice, static random access memory (SRAM) dice, or the like. In an embodiment in which multiple dice are provided in a single assembly, the semiconductor devices could be memory dice of a same kind (e.g., both NAND, both DRAM, etc.) or memory dice of different kinds (e.g., one DRAM and one NAND, etc.). In accordance with another aspect of the present disclosure, the semiconductor dice of the assemblies illustrated and described above could be logic dice (e.g., controller dice, processor dice, etc.), or a mix of logic and memory dice (e.g., a memory controller die and a memory die controlled thereby).

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

As used herein, the terms "top," "bottom," "over," "under," "above," and "below" can refer to relative directions or positions of features in the semiconductor devices in view of the orientation shown in the Figures. These terms, however, should be construed broadly to include semiconductor devices having other orientations, such as inverted or inclined orientations where top/bottom, over/under, above/below, up/down, and left/right can be interchanged depending on the orientation.

It should be noted that the methods described above describe possible implementations, and that the operations and the steps may be rearranged or otherwise modified and that other implementations are possible. Furthermore, embodiments from two or more of the methods may be combined.

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. An antifuse device, comprising:
   a gate having a gate dielectric layer;
   a first doping region connected to a first end of the gate;
   a second doping region connected to a second end of the gate, the second end being opposite to the first end of the gate;
   a channel that is disposed under the gate and that connects the first doping region and the second doping region;
   an interconnection jumper that electrically connects the first doping region and the second doping region; and
   a fin that directly connects the first doping region and the second doping region, wherein the gate dielectric layer is disposed on a top surface and two sidewalls of the fin.

2. The antifuse device of claim 1, wherein a programming voltage is applied between the gate and the first doping region and/or the gate and the second doping region to break down the gate dielectric layer and short the antifuse device.

3. The antifuse device of claim 1, wherein the interconnection jumper comprises at least one of copper, tungsten, molybdenum, nickel, titanium, tantalum, platinum, silver, gold, ruthenium, iridium, rhenium, rhodium, or an alloy thereof.

4. The antifuse device of claim 1, wherein the interconnection jumper maintains the first doping region and the second doping region at a same voltage level.

5. The antifuse device of claim 4, wherein the first doping region and the second doping region are configured, through the interconnection jumper, to be grounded in order to short the antifuse device by applying a gate voltage.

6. The antifuse device of claim 1, wherein the channel is disposed under the top surface and two sidewalls of the fin.

7. The antifuse device of claim 6, wherein the gate dielectric layer is configured to break down at at least one of the top corners of the fin and bottom edges of the fin in order to short the antifuse device.

8. The antifuse device of claim 7, wherein the antifuse device is configured to be shorted by forming:
- a first pair of primary breakdown regions that are disposed in the channel and along the top corners of the fin respectively, the first pair of primary breakdown regions being connected to the first doping region and extending toward the second doping region, and
- a second pair of primary breakdown regions that are disposed in the channel and along the top corners of the fin respectively, the second pair of primary breakdown regions being connected to the second doping region and extending toward the first doping region.

9. The antifuse device of claim 8, wherein the first and second pairs of primary breakdown regions merge along the top corners of the fin.

10. The antifuse device of claim 8, wherein the gate dielectric layer adjacent to the first pair of primary breakdown regions and/or the second pair of primary breakdown regions is configured to break down in order to short the antifuse device.

11. The antifuse device of claim 1, wherein the channel, the first doping region, and the second doping region are disposed under a front surface of a substrate, and wherein the gate is disposed on the front surface of the substrate.

12. The antifuse device of claim 11, wherein the gate overhangs at least a portion of the first doping region and/or a portion of the second doping region.

13. The antifuse device of claim 12, wherein the antifuse device is configured to be shorted by forming:
- a first primary breakdown region disposed in the first doping region and under the gate overhang region, and
- a second primary breakdown region disposed in the second doping region and under the gate overhang region.

14. The antifuse device of claim 13, wherein the gate dielectric layer adjacent to the first primary breakdown region or the second primary breakdown region is configured to break down in order to short the antifuse device.

15. An antifuse device, comprising:
- a fin field-effect transistor (FinFET) having a fin, a source, a drain, and a gate containing a gate dielectric layer, the source and drain of the FinFET being connected by the fin;
- an interconnection jumper that electrically connects the source and drain of the FinFET,
- wherein the gate dielectric layer is disposed on a top surface and two sidewalls of the fin, and
- wherein the antifuse device is configured to be shorted by forming:
  - a first pair of primary breakdown regions that are disposed in a channel of the FinFET and along top corners of the fin respectively, the first pair of primary breakdown regions being connected to the source of the FinFET and extending toward the drain of the FinFET, and
  - a second pair of primary breakdown regions that are disposed in the channel of the FinFET and along the top corners of the fin respectively, the second pair of primary breakdown regions being connected to the drain of the FinFET and extending toward the source of the FinFET.

16. The antifuse device of claim 15, wherein the gate dielectric layer adjacent to the first pair of primary breakdown regions and/or the second pair of primary breakdown regions is configured to break down in order to short the antifuse device.

17. The antifuse device of claim 15, wherein the gate dielectric layer is configured to break down at at least one of the top corners of the fin and bottom edges of the fin in order to short the antifuse device.

18. An antifuse device, comprising:
- a planar metal-oxide-semiconductor field-effect transistor (MOSFET) having a source, a drain, and a gate containing a gate dielectric layer, the gate overhangs at least a portion of the source and/or the drain;
- an interconnection jumper that electrically connects the source and drain of the MOSFET; and
- a fin that directly connects the source and the drain, wherein the gate dielectric layer is disposed on a top surface and two sidewalls of the fin,
- wherein the antifuse device is configured to be shorted by forming:
  - a first primary breakdown region disposed in the source and under the gate overhang region, and
  - a second primary breakdown region disposed in the drain and under the gate overhang region.

19. The antifuse device of claim 18, wherein the gate dielectric layer adjacent to the first primary breakdown region and/or the second primary breakdown region is configured to break down in order to short the antifuse device.

\* \* \* \* \*